United States Patent
Farkas et al.

(10) Patent No.: US 10,856,411 B2
(45) Date of Patent: Dec. 1, 2020

(54) SYSTEM AND METHOD FOR DESIGN OF HIGH SPEED SIGNALING AND POWER DELIVERY

(71) Applicant: Dell Products, L.P., Round Rock, TX (US)

(72) Inventors: Sandor Farkas, Round Rock, TX (US); Bhyrav M. Mutnury, Austin, TX (US); Steven Richard Ethridge, Austin, TX (US)

(73) Assignee: Dell Products, L.P., Round Rock, TX (US)

( * ) Notice: Subject to any disclaimer, the term of this patent is extended or adjusted under 35 U.S.C. 154(b) by 0 days.

(21) Appl. No.: 16/023,740

(22) Filed: Jun. 29, 2018

(65) Prior Publication Data

US 2020/0008296 A1    Jan. 2, 2020

(51) Int. Cl.

| | |
|---|---|
| *H05K 1/00* | (2006.01) |
| *H05K 1/02* | (2006.01) |
| *H05K 1/11* | (2006.01) |
| *H05K 1/18* | (2006.01) |
| *H01R 12/70* | (2011.01) |
| *H05K 3/46* | (2006.01) |
| *H05K 3/00* | (2006.01) |

(52) U.S. Cl.
CPC ....... *H05K 1/0298* (2013.01); *H01R 12/7088* (2013.01); *H05K 1/0228* (2013.01); *H05K 1/116* (2013.01); *H05K 1/183* (2013.01); *H05K 3/0047* (2013.01); *H05K 3/4644* (2013.01); *H05K 3/4697* (2013.01)

(58) Field of Classification Search
CPC .... H05K 1/0298; H05K 1/0228; H05K 1/116; H05K 1/183; H05K 3/0047; H05K 3/4644; H05K 3/4697; H01R 12/7088
See application file for complete search history.

(56) References Cited

U.S. PATENT DOCUMENTS

| | | | |
|---|---|---|---|
| 6,272,020 B1* | 8/2001 | Tosaki | H05K 1/0231 361/763 |
| 8,975,754 B2* | 3/2015 | Thacker | H01L 29/0657 257/618 |
| 9,202,783 B1* | 12/2015 | Simpson | H01L 23/49838 |
| 10,159,152 B2* | 12/2018 | Campbell | H05K 1/183 |
| 2007/0085200 A1* | 4/2007 | Lu | H01L 21/4857 257/724 |

(Continued)

*Primary Examiner* — Pete T Lee
(74) *Attorney, Agent, or Firm* — Fogarty LLP

(57) ABSTRACT

A printed circuit board (PCB) includes a plurality of layers and electronic components connected to its top surface. The PCB also includes a plurality of trace layers, each located at a respective depth within the layers of the PCB. A plurality of vias provide signal pathways for the trace layer. Upon their manufacture, the vias include a stub portion not necessary for the signal pathways and causing degradation of the integrity of these signal pathways. Embodiments mill the bottom of the PCB to form a variable-depth cavity. The different milling depths of the variable-depth cavity are selected to remove the stub portions of the plurality of vias and the dielectric material between the stubs. By configuring the PCB power planes as the topmost trace layers, decoupling capacitors may be located at the greatest depth of the variable-depth cavity, thus reducing the loop inductance in the power circuit of the PCB.

16 Claims, 4 Drawing Sheets

(56) References Cited

U.S. PATENT DOCUMENTS

| | | | |
|---|---|---|---|
| 2007/0091581 A1* | 4/2007 | Gisin | H05K 1/0246 |
| | | | 361/782 |
| 2007/0187137 A1* | 8/2007 | Isebo | H05K 1/183 |
| | | | 174/255 |
| 2009/0173532 A1* | 7/2009 | Sugane | H05K 3/421 |
| | | | 174/262 |
| 2015/0189754 A1* | 7/2015 | Bohra | H05K 3/22 |
| | | | 174/262 |

* cited by examiner

SYSTEM AND METHOD FOR DESIGN OF HIGH SPEED SIGNALING AND POWER DELIVERY

FIELD

This disclosure relates generally to Information Handling Systems (IHSs), and more specifically, to printed circuit boards (PCBs) used in IHSs.

BACKGROUND

As the value and use of information continues to increase, individuals and businesses seek additional ways to process and store information. One option is an Information Handling System (IHS). An IHS generally processes, compiles, stores, and/or communicates information or data for business, personal, or other purposes. Because technology and information handling needs and requirements may vary between different applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, global communications, etc. In addition, IHSs may include a variety of hardware and software components that may be configured to process, store, and communicate information and may include one or more computer systems, data storage systems, and networking systems.

An IHS may include one or more printed circuit boards (PCBs). A variety of electrical hardware components may be mechanically coupled to a PCB. The electrical hardware components may also be electrically coupled to various circuit pathways provided by the PCB. PCBs may be utilized within a wide variety of devices and machines. For example, in the context of personal and enterprise computing, PCBs may be used to construct motherboards, microcontrollers, memories, storage devices, peripherals cards (e.g., network interface cards) and a wide variety of other electronic components.

A PCB is typically constructed using multiple alternating layers of conductive and insulating materials that are laminated together. The conductive layers of the PCB may be referred to as trace layers and the circuit pathways formed within a conductive layer may be referred to as a trace. Components that are mechanically connected to the PCB may be electrically connected to other components on the PCB via signaling pathways that are formed from the trace layers, while the alternating resin layers isolate the trace layers. In order to connect trace layers to each other and to the components mechanically coupled to the surface of the PCB, vias may be drilled in the PCB at locations where the traces in different trace layers overlap. The vias may then be filled with a conductive material to connect the circuit pathways in different trace layers.

During manufacture of a PCB, each via is formed by drilling a hole through the PCB, or very nearly through the PCB, at locations at which the drilled hole intersects with the trace layers to be connected by the via. The entire length of the drilled hole is then filled or coated with a conductive material, thus completing the signal pathway between the layers. As a result, in certain signaling pathways, a portion of a via may be unused in the sense that such portion is present but not needed to conduct a signal between trace layers. Such open circuit stubs in a signaling pathway introduce an impedance discontinuity into the signaling pathway. Such discontinuities in a signal pathway reduce signal integrity and lead to increased bit error rates and, in certain instances, device failures. These problems posed by the impedance discontinuity at via stubs are magnified as the speeds increase in the communication protocols utilizing these signal pathways.

SUMMARY

In various embodiments, a printed circuit board (PCB) includes a plurality of layers and a plurality of electronic components connected to the top surface of the PCB. The PCB further includes: a plurality of trace layers, wherein each trace layer is located at a respective depth within the plurality of layers of the PCB; a plurality of vias, wherein each via provides a signal pathway for one or more of the trace layers, and wherein each via, upon manufacture, comprised a stub portion not necessary for the signal pathway; and wherein the bottom of the PCB is milled to form a variable-depth cavity in the bottom of the PCB, and wherein one or more of the depths of the variable-depth cavity are selected to remove the stub portions of the plurality of vias.

In various additional embodiments of the PCB, wherein each of the via signal pathways connects a trace layer to a respective connector on the top of the PCB and wherein the respective connectors form an array of connectors on the top surface of the PCB. In various additional embodiments of the PCB, the depth of the variable-depth cavity is greatest at the center of the array of top surface connectors. In various additional embodiments of the PCB, the depth of the variable-depth cavity is least at the edges of the array of top surface connectors. In various additional embodiments of the PCB, a trace layer designated as a power plane is the closest of the plurality of trace layers to the top surface of the PCB. In various additional embodiments of the PCB, the power plane provides power to a processor connected to the top surface of the PCB via the array of connectors. In various additional embodiments, the PCB may include a capacitor connected to the power plane and the processor by vias located at the greatest depth of the variable-depth cavity. In various additional embodiments of the PCB, the capacitor is coupled to the PCB at the greatest depth of the variable-depth cavity.

In various additional embodiments, a method is provided for manufacturing a printed circuit board (PCB) including a plurality of layers and a plurality of electronic components connected to the top surface of the PCB. The method may include: depositing a plurality of trace layers, wherein each trace layer is located at a respective depth within the plurality of layers of the PCB; drilling a plurality of vias, wherein each via provides a signal pathway for one or more of the trace layers, and wherein each via, upon drilling, comprises a stub portion not necessary for the signal pathway; and milling a variable-depth cavity in the bottom of the PCB, wherein one or more of the depths of the variable-depth cavity are selected to remove the stub portions of the plurality of vias.

In various additional embodiments of the method, each of the via signal pathways connects a trace layer to a respective connector on the top of the PCB and wherein the respective connectors form an array of connectors on the top surface of the PCB. In various additional embodiments of the method, the depth of the variable-depth cavity is greatest at the center of the array of top surface connectors. In various additional embodiments of the method, the depth of the variable-depth cavity is least at the edges of the array of top surface connectors. In various additional embodiments of the method, a trace layer designated as a power plane is the closest of the plurality of trace layers to the top of the PCB. In various additional embodiments of the method, power plane provides power to a processor connected to the top surface of the PCB via the array of connectors. In various additional embodiments, the method further includes connecting a capacitor to the power lane and the processor by vias located at the greatest depth of the variable-depth cavity. In various additional embodiments of the method, the capacitor is coupled to the PCB at the greatest depth of the variable-depth cavity.

In various additional embodiments, an IHS (Information Handling System) includes a printed circuit board (PCB) comprising a plurality of layers and a plurality of electronic components connected to the top surface of the PCB. The PCB includes: a plurality of trace layers, wherein each trace layer is located at a respective depth within the plurality of layers of the PCB; a plurality of vias, wherein each via provides a signal pathway for one or more of the trace layers, and wherein each via, upon manufacture, comprised a stub portion not necessary for the signal pathway; and wherein the bottom of the PCB is milled, wherein the milling forms a variable-depth cavity in the bottom of the PCB, and wherein one or more of the depths of the variable-depth cavity are selected to remove the stub portions of the plurality of vias.

In various additional embodiments of the IHS, each of the via signal pathways connects a trace layer to a respective connector on the top of the PCB, and wherein the respective connectors form an array of connectors on the top of the PCB. In various additional embodiments of the IHS, the depth of the variable-depth cavity is greatest at the center of the array of top surface connectors, and wherein a trace layer designated as a power plane is the closest of the plurality of trace layers to the top of the PCB. In various additional embodiments of the IHS, the PCB further includes a capacitor connected to the power plane and the processor by vias located at the greatest depth of the variable-depth cavity.

BRIEF DESCRIPTION OF THE DRAWINGS

The present invention(s) is/are illustrated by way of example and is/are not limited by the accompanying figures, in which like references indicate similar elements. Elements in the figures are illustrated for simplicity and clarity, and have not necessarily been drawn to scale.

DETAILED DESCRIPTION

For purposes of this disclosure, an IHS may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an IHS may be a personal computer (e.g., desktop or laptop), tablet computer, mobile device (e.g., Personal Digital Assistant (PDA) or smart phone), server (e.g., blade server or rack server), a network storage device, or any other suitable device and may vary in size, shape, performance, functionality, and price. An IHS may include Random Access Memory (RAM), one or more processing resources, such as a Central Processing Unit (CPU) or hardware or software control logic, Read-Only Memory (ROM), and/or other types of nonvolatile memory.

Figure 1:
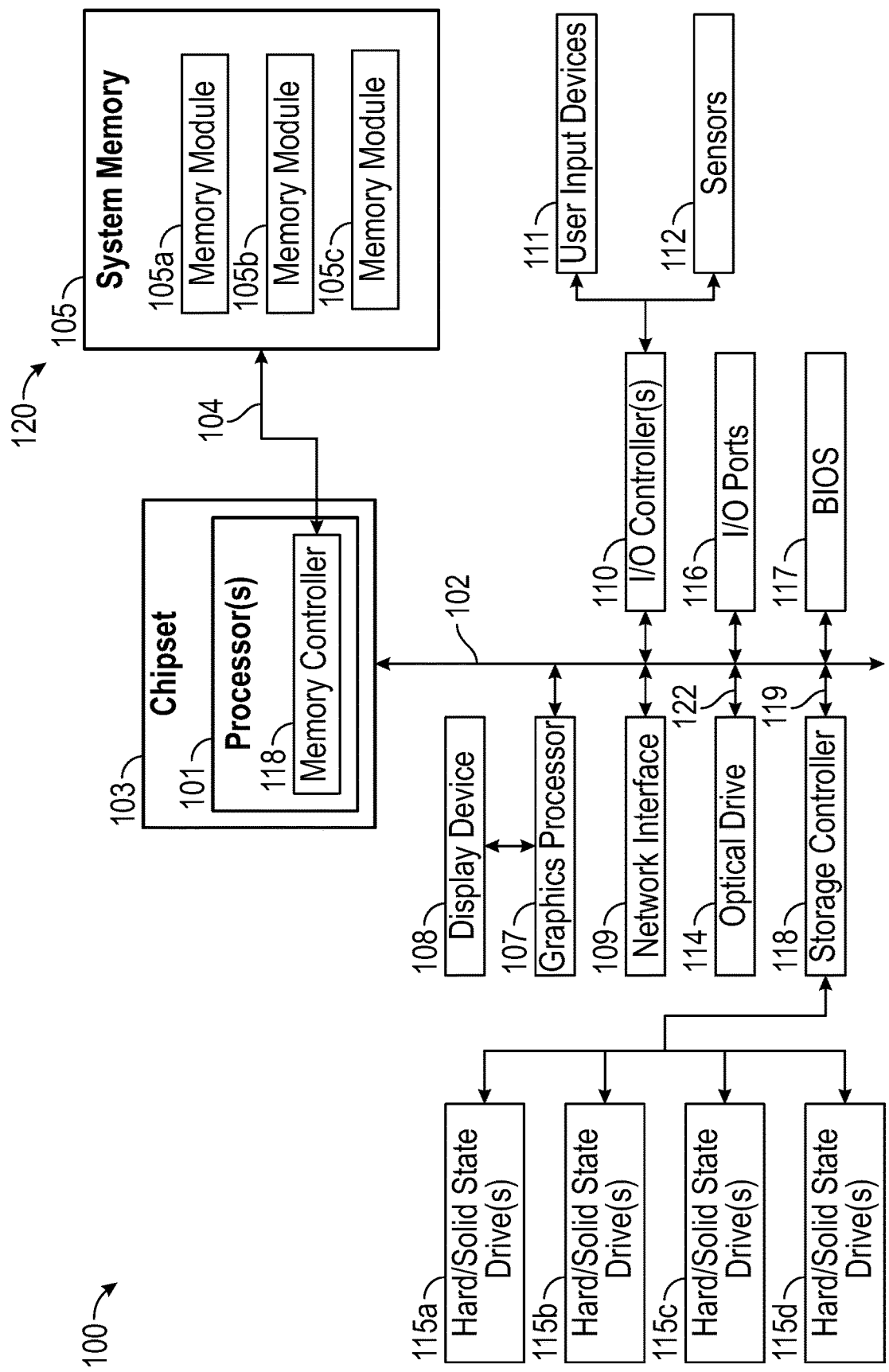
FIG. 1 is a block diagram depicting certain components of an IHS according to various embodiments.

Additional components of an IHS may include one or more disk drives, one or more network ports for communicating with external devices as well as various I/O devices, such as a keyboard, a mouse, touchscreen, and/or a video display. An IHS may also include one or more buses operable to transmit communications between the various hardware components. An example of an IHS is described in more detail below. FIG. 1 shows an example of an IHS configured to implement the systems and methods described herein according to certain embodiments. It should be appreciated that although certain IHS embodiments described herein may be discussed in the context of an enterprise server computer comprised within an enterprise system of similar enterprise servers, other embodiments may be utilized.

FIG. 1 is a block diagram of an IHS 100 that may utilize various components that may utilize a PCB milled according to the embodiments described herein. In various embodiments, IHS 100 may execute program instructions that cause IHS 100 to perform certain of the operations disclosed herein. While a single IHS 100 is illustrated in FIG. 1, IHS 100 may be a component of an enterprise system that may include any number of additional IHSs that may also be configured in the same or similar manner to IHS 100. An IHS 100 may also be a personal computing device, such as a laptop, tablet or smartphone device. An IHS may also be an appliance, an audio device, a video device, a gaming device, a virtual reality device, a networking device or any machine that includes a PCB.

IHS 100 includes one or more processors 101 coupled to the motherboard of the IHS, such as a Central Processing Unit (CPU), to execute code retrieved from a system memory 105. Although IHS 100 is illustrated with a single processor 101, other embodiments may include two or more processors, that may each be configured identically, or to provide specialized processing functions. Processor 101 may include any processor capable of executing program instructions, such as an Intel Pentium™ series processor or any general-purpose or embedded processors implementing any of a variety of Instruction Set Architectures (ISAs), such as the x86, POWERPC®, ARM®, SPARC®, or MIPS® ISAs, or any other suitable ISA.

In the embodiment of FIG. 1, the processor 101 includes an integrated memory controller 118 that may be implemented directly within the circuitry of the processor 101, or the memory controller 118 may be a separate integrated circuit that is located on the same die as the processor 101. The memory controller 118 may be configured to manage the transfer of data to and from the system memory 105 of the IHS 100 via a high-speed memory interface 104.

The system memory 105 that is coupled to processor 101 via the memory bus 104 provides the processor 101 with a high-speed memory that may be used in the execution of computer program instructions by the processor 101.

Accordingly, system memory 105 may include memory components, such as such as static RAM (SRAM), dynamic RAM (DRAM), NAND Flash memory, suitable for supporting high-speed memory operations by the processor 101. In certain embodiments, system memory 105 may combine both persistent, non-volatile memory and volatile memory.

In certain embodiments, the system memory 105 may be comprised of multiple removable memory modules, each of which may utilize a PCB. The system memory 105 of the illustrated embodiment includes three removable memory modules 105a, 105b and 105c. Each of the removable memory modules 105a-c may correspond to a motherboard memory socket that receives a removable memory module 105a-c, such as a DIMM (Dual In-line Memory Module), that can be coupled to the socket and then decoupled from the socket as needed, such as to upgrade memory capabilities or to replace faulty components. Other embodiments of IHS 100 may be configured with memory socket interfaces that correspond to different types of removable memory modules, such as a Dual In-line Package (DIP) memory, a Single In-line Pin Package (SIPP) memory, a Single In-line Memory Module (SIMM), and/or a Ball Grid Array (BGA) memory.

IHS 100 utilizes a chipset 103 that may include one or more integrated circuits that are connect to processor 101. In the embodiment of FIG. 1, processor 101 is depicted as a component of chipset 103. In other embodiments, all of chipset 103, or portions of chipset 103 may be implemented directly within the integrated circuitry of the processor 101. Chipset 103 provides the processor(s) 101 with access to a variety of resources accessible via bus 102. In IHS 100, bus 102 is illustrated as a single element. Various embodiments may utilize any number of buses to provide the illustrated pathways served by bus 102.

As illustrated, a variety of resources may be coupled to the processor(s) 101 of the IHS 100 through the chipset 103. For instance, chipset 103 may be coupled to a network interface 109, such as provided by a Network Interface Controller (NIC) constructed from PCB and coupled to the IHS 100, thus allowing the IHS 100 to communicate via a network, such as the Internet or a LAN. Network interface device 109 may provide IHS 100 with wired and/or wireless network connections via a variety of network technologies, such as wireless cellular or mobile networks (CDMA, TDMA, LTE etc.), WIFI and BLUETOOTH. In certain embodiments, the network interface 109 may be coupled to the chipset 103 via a PCIe bus.

Chipset 103 may also provide access to one or more display device(s) 108 via graphics processor 107. In certain embodiments, graphics processor 107 may be comprised within one or more video or graphics cards or an embedded controller constructed using PCB and installed as components of the IHS 100. Graphics processor 107 may generate display information and provide the generated information to one or more display device(s) 108 coupled to the IHS 100. In certain embodiments, graphics processor 107 may be integrated within processor 101. The one or more display devices 108 coupled to IHS 100 may utilize LCD, LED, OLED, or other thin film display technologies and may include one or more PCB components. Each display device 108 may be capable of touch input such as via a touch controller that may be an embedded component of display device 108, graphics processor 107, or a separate component of IHS 100 accessed via bus 102.

In certain embodiments, chipset 103 may utilize one or more I/O controllers to access hardware components such as user input devices 111 and sensors 112. For instance, I/O controller 110 may provide access to user-input devices 110 such as a keyboard, mouse, touchpad, touchscreen and/or other peripheral input devices. The user input devices may interface with the I/O controller 110 through wired or wireless connections. Sensors 112 accessed via I/O controllers 110 may provide access to data describing environmental and operating conditions of IHS 100. Other components of IHS 100 may include one or more I/O ports 116 for communicating with peripheral external devices as well as various input and output devices. For instance, I/O 116 ports may include USB (Universal Serial Bus) ports, by which a variety of external devices may be coupled to IHS 100.

As illustrated, IHS 100 also includes a BIOS (Basic Input/Output System) 117 that may be stored in a non-volatile memory accessible by chipset 103 via bus 102. The BIOS 117 provides an abstraction layer that allows the operating system to interface with the hardware components of the IHS 100. Upon powering or restarting IHS 100, processor(s) 101 may utilize BIOS 117 instructions to initialize and test hardware components coupled to the IHS 100, including both components permanently installed as components of the motherboard of IHS 100 and removable components installed within the various expansion slots supported by the IHS 100. The BIOS 117 instructions may also load an operating system for use by the IHS 100. The Unified Extensible Firmware Interface (UEFI) was designed as a successor to BIOS. As a result, many modern IHSs utilize UEFI in addition to or instead of a BIOS. As used herein, BIOS is intended to also encompass UEFI.

In the illustrated embodiment, IHS 100 includes four storage drives 115a-d, each of which may be constructed using a PCB component. In various embodiments, the four storage drives 115a-d may include SAS (Serial Attached SCSI) magnetic disk drives, SATA (Serial Advanced Technology Attachment) magnetic disk drives, solid-state drives (SSDs) and other types of storage drives in various combinations. Each of the storage drives 115a-d may be located within the enclosure of the IHS 100, or alternatively one or more of the storage drives 115a-d may instead be external to IHS 100. One or more of the storage drives 115a-d may instead be located remotely from IHS 100 and may be configured as network attached storage devices. Using these four storage drives 115a-d, IHS 100 may be configured as a server that provides various services as a part of a cloud implementation of multiple servers that may be distributed across multiple physical locations. In certain embodiments, the four storage drives 115a-d may be components of a RAID (Redundant Array of Independent Disks) system. In providing storage services, IHS 100 is may utilize a storage controller 118 that provides access to the four storage drives 115a-d.

In various embodiments, an IHS 100 does not include each of the components shown in FIG. 1. In various embodiments, an IHS 100 may include various additional components in addition to those that are shown in FIG. 1. Furthermore, some components that are represented as separate components in FIG. 1 may in certain embodiments instead be integrated with other components. For example, in certain embodiments, all or a portion of the functionality provided by the illustrated components may instead be provided by components integrated into the one or more processor(s) 101 as a systems-on-a-chip.

Figure 2:
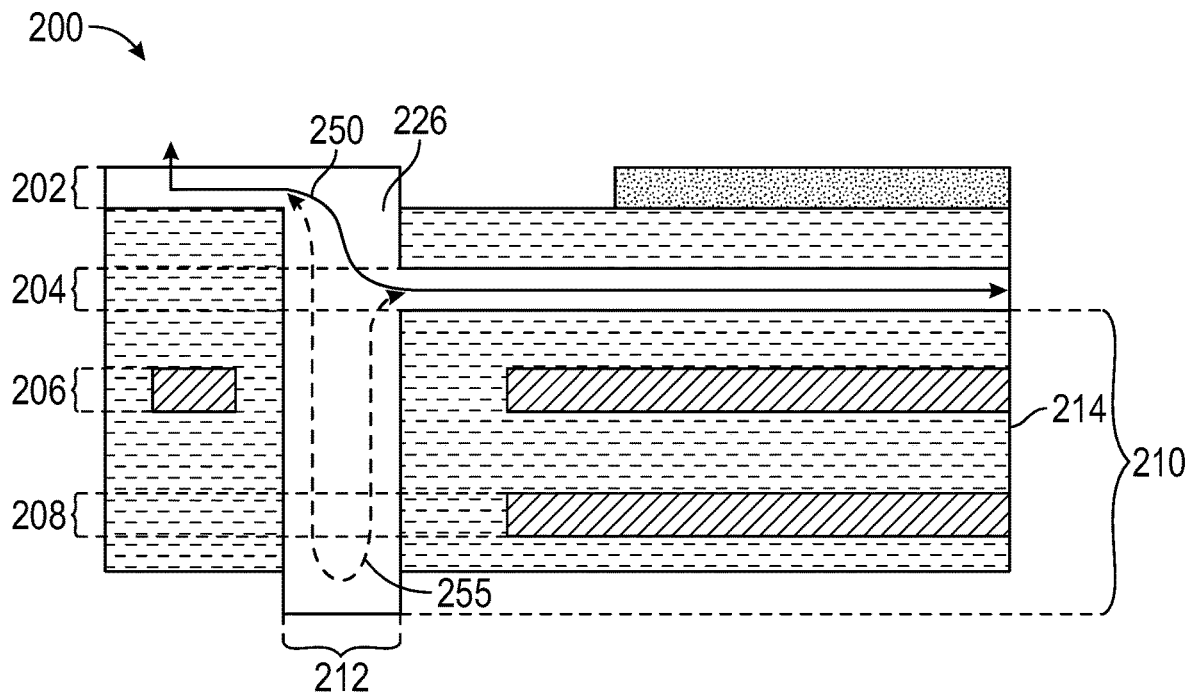
FIG. 2 is a diagram of a cross-section of a PCB illustrating certain aspects of a via portion of a PCB signal pathway.

FIG. 2 depicts certain aspects of a cross-section of a portion of a PCB 200 that includes a via 212 that traverses all of the layers of the PCB 200. The PCB 200 includes four trace layers 202, 204, 206 and 208. Trace layer 202 is located on the top surface of the PCB and may be used to establish an electrical connection to an electrical component connected to the PCB 200. The trace layers 202, 204, 206, and 208 are insulated from each other by layers of an insulating material 214 that may be a rigid resin or a flexible material. The via 212 may be formed by drilling a hole through the layers of the PCB 200. The drilled hole of the via 212 is filled and/or coated with a conductive material, thus providing an electrical connection between the trace layers 202, 204, 206 and 208.

As illustrated in FIG. 2, the via 212 creates a signal pathway 250 in the PCB 200 between the traces layers 202 and 204. The signal pathway 250 allows a communications signal to be transmitted to components connected to traces layers 202 and 204. However, the communications signal is also communicated along an undesired signal path 255 within a stub portion 210 of the via 212. This via stub 210 is not necessary to the signal pathway 250 between traces 202 and 214 and is thus an extraneous portion of the via 212. As illustrated, the via stub 210 results in an open circuit stub that results in a current loop 255 circulating within the stub 210 portion of the via 212. The effects of this current loop 255 rejoining the signal pathway 250 results in degradation of the signal being transmitted on the signal pathway 250. At certain resonant frequencies, the signal on the signal pathway 250 can be entirely cancelled by the current loop 255. One approach that may be employed to mitigate the effects of via stubs on signal integrity is backdrilling.

Figure 3:
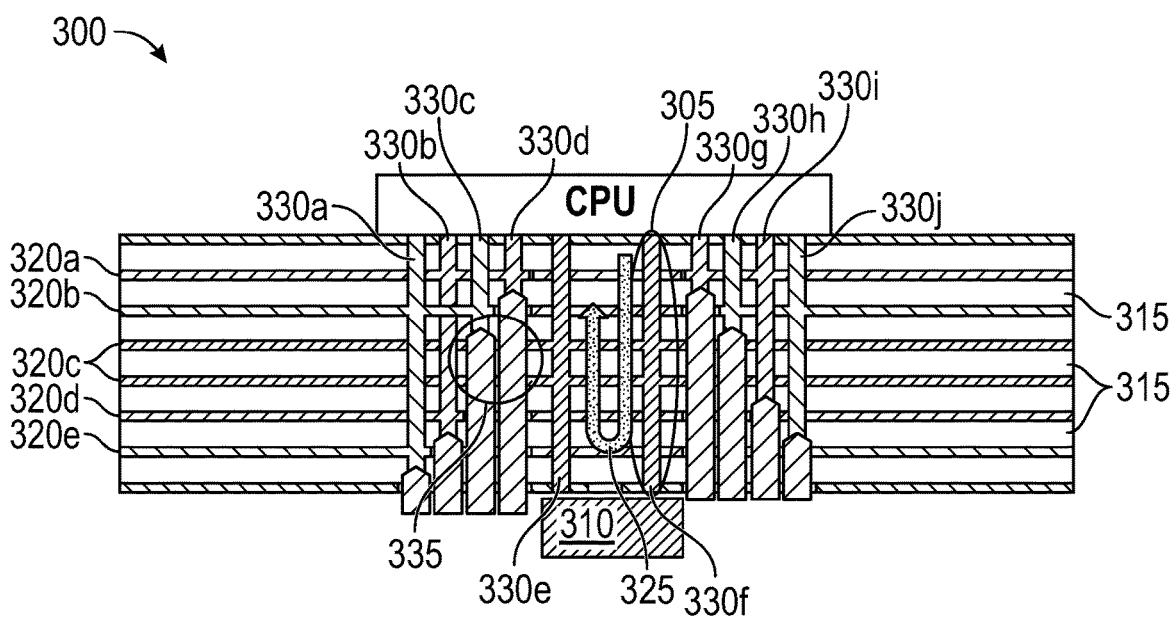
FIG. 3 is a diagram of a cross-section of a PCB modified using a post-production backdrill process.

FIG. 3 depicts a cross-section of a portion of a PCB 300 modified using a post-production backdrill process. PCB 300 is constructed such that conductive trace layers 320*a-e* are isolated from each other by alternating layers of insulating material 315. In PCB 300, the trace layers 320*a-e* provide signaling pathways for a CPU 305 that is mechanically coupled to the top surface of the PCB 300. In certain scenarios, CPU 305 may be electrically coupled on the top surface PCB 300 via an array of CPU connectors, such as a ball grid array, where each CPU connector is electronically coupled to a pad on the surface of PCB 300 that corresponds to one of the vias 330*a-j* drilled in PCB 300. Each of the vias 330*a-j* forms a circuit pathway between a CPU connector and one or more of the trace layers 320*a-e*.

In a typical PCB supporting a processing resource such as CPU 305, one or more of the trace layers 320*a-e* are designated as power and ground planes. These power and power planes 320*c* may be collectively referred to as power planes and may be used to deliver power to CPU 305. In light of the response times and high frequencies of supported by modern processors, a decoupling or bypass capacitor may be utilized in the PCB pathway by which the power planes 320*c* are routed to processor 305. In PCB 300, power planes 320*c* are connected to a pair of vias 330*e-f* that connects the CPU 305 to a decoupling capacitor 310 located at the bottom of the stack of layers. The decoupling capacitor 310 stabilizes voltage fluctuations in the power plane 320*c*, thus providing CPU 305 with a steady voltage source.

The connection of the decoupling capacitor 310 to the power and ground planes 320*c* via the pair of vias 330*e-f* creates a current loop 325 that results in a loop inductance. This loop inductance reduces the effectiveness of the decoupling capacitor 310 in stabilize voltage fluctuations in the power plane 320*c*. At faster chip speeds and higher frequencies, this loop inductance further impedes the function of the decoupling capacitor 310. The vias 330*e-f* connecting the decoupling capacitor 310 to the CPU 305 traverse the full thickness of the PCB 300. As more layers are added to the PCB 300, the board becomes thicker, thus resulting in vias 330*e-f* becoming longer. This results in a longer current loop 325 and a greater loop inductance, further diminishing the effectiveness of the decoupling capacitor 310.

As described with regard to FIG. 2, the stub portion of a via results in signal degradation within the signal pathways of the PCB. Backdrilling addresses these issues caused by via stubs by removing the stub portion of the via. As illustrated by the back-drilled portions of vias 330*a-d, g-j* in FIG. 2, the backdrilling process uses a drill bit slightly larger in diameter than the diameter of the via to remove the unneeded stub portions of the vias 335*a-d, g-j*. Power planes 320*c* are typically located near the center of a PCB 300. As illustrated by the back-drilled portions of vias 335*c-d* and 335 *g-h*, backdrilling to remove via stubs for layers above the power planes 320*c* requires backdrilling through the power plane itself. This drilling results in weakening of the structural integrity of the power plane near its intersection with vias 330*e-f* that connect the ground plane to the CPU 305 and the decoupling capacitor 310. One such area of weakening of the power plane and the power circuit due to backdrilling is located in area 335 of FIG. 3. The greater the number of vias above the power plane that are being back-drilled, the greater the impact on the integrity of the power plane.

Figure 4:
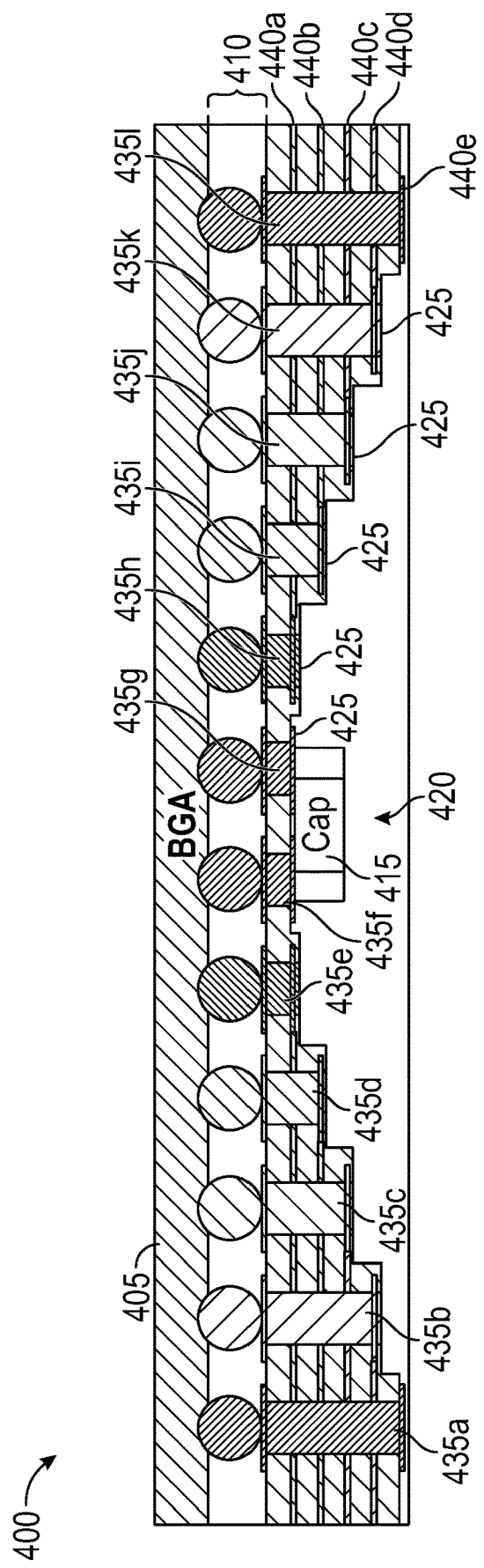
FIG. 4 is a diagram of a cross-section of a PCB modified according to certain embodiments to include a variable-depth cavity in the bottom of the PCB.

FIG. 4 is a diagram of a cross-section of a PCB 400 modified according to certain embodiments to include a variable-depth cavity 420 in the bottom of the PCB 400. In the embodiment of FIG. 4, a Ball Grid Array (BGA) of connectors 405 is electrically coupled to the PCB 400 via an array of ball connectors 410 that are each individually connected to a corresponding connection pad 410 in an array of connection pads on the surface of PCB 400. Each of these connection pads is connected to one of the vias 435*a-l*, each of which provides a connection pathway to one or more of the trace layers 440*a-e* that comprise the PCB 400 at various depths. Although a BGA connection interface is illustrated in FIG. 4, other embodiments may utilize various other types and configurations of packaging by which a component may be electrically coupled to a printed circuit board.

As illustrated in FIG. 4, the variable-depth cavity 420 removes the stub portion of each of the vias 435*a-l*. Whereas backdrilling removes only a cylindrical portion of the PCB that includes a stub, in embodiments such as PCB 400, all unnecessary portions of the insulating PCB material along with the via stubs have been removed, thus creating a cavity 420 in the bottom side of PCB 400. As described above, one or more of the trace layers of a printed circuit board may be designated as power planes. Within the stack of layers from which a printed circuit board is constructed, such power planes are typically placed near the middle of the stack. Such power plane configurations have been demonstrated to be the most practical in terms of minimizing signal degradation, including the described loop impedance caused by the power plane vias extending from a CPU to a decoupling capacitor, such as described with regard to FIG. 3.

In the embodiment of FIG. 4, the power plane trace layer 440*a* is located at the top of the stack of trace layers 440*a-e* from which PCB 400 is constructed. The remaining trace layers 440*b-e* may be used for signaling. With the power plane 440*a* located at the top of the PCB 400, the stubs for the power plane vias 435*f-g* may be milled, thus creating the deepest point of the cavity 420, such that, at its center, the cavity 420 extends to the vicinity of the power plane 440*a* at the top of the PCB 400. Through design of the trace layers 440*a-e*, and in certain cases through the design of the array of supported connections, the trace layers 440*a-e* coupled to each via 435*a-l* may be selected, according to various embodiments, such that the vias nearest center of the BGA 405 provide circuit pathways for trace layers 435a-e nearest the top surface of the PCB 400.

For instance, in FIG. 4, the two vias 435e, 435h that are located nearest the power plane vias 430f-g, and thus nearest the center of the array of BGA connectors, provide circuit pathways for trace level 440b, which is the trace level closest to the power plane 440a, such that trace layer 440b is the closest signaling trace to the top of the PCB 400. Likewise, the two vias 435d, 435i that are located next closest to the power plane vias 430f-g provide connections to the next trace layer 440c, going down the stack of layers that comprise the PCB 400. This process may be repeated with each set of vias until the vias 435a, 435l that are closest to the outer edge of the BGA 405 provide connections to the bottom trace layer 440d.

By configuring the vias 435a-l and the trace layers 440a-e in this manner and by assignment of the top trace layer 440a as a power plane, each of the resulting via stubs is progressively longer moving from the edge of the BGA 405 towards the center. By removing via stubs configured in the manner, and also removing the unnecessary insulating material between the stubs, the variable-depth cavity 420 is created through milling. By using a milling bit that removes materially when the bit is moved both vertically and laterally, the milling bit may be used to remove the stub portions of each of the vias 435a-l and subsequently moved laterally to remove all unnecessary insulating material portions of PCB 400 between the stubs. The resulting cavity 420 thus is formed in a staircase pattern 425 along the PCB 400 surface of the cavity 420. Other embodiments may utilize configurations of vias, trace layers, and power plane assignments such that different shaped cavities may result. For instance, the resulting cavity need not be symmetrical. In addition, multiple vias may utilize the same trace levels, such that multiple vias may be of the same length. Such configurations may result in stepped patterns that include different sizes of steps.

Figure 5:
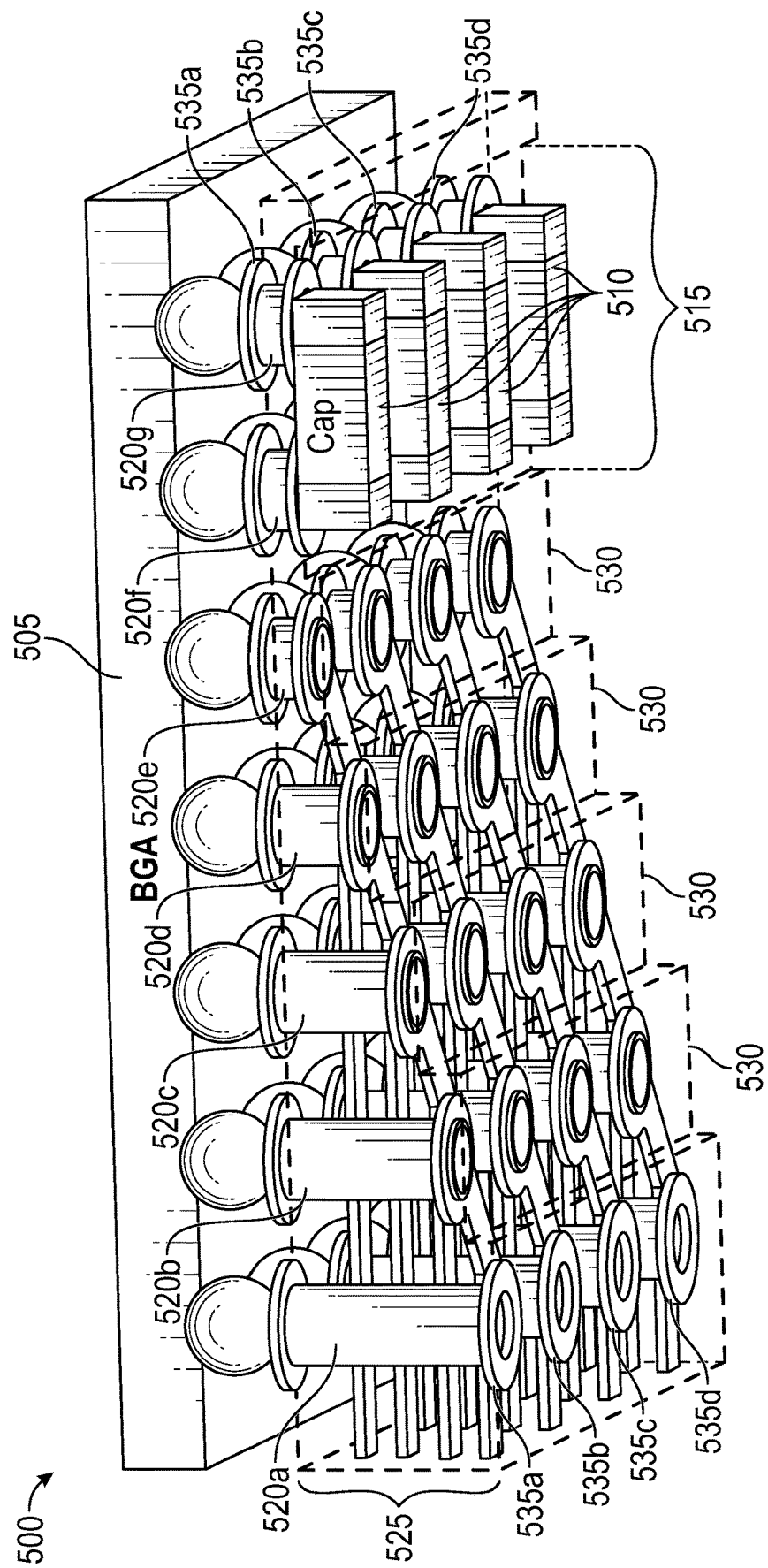
FIG. 5 is a diagram of a three-dimensional view of a PCB modified according to certain embodiments to include a variable-depth cavity in the bottom of the PCB.

In the illustrated staircase pattern 425 of FIG. 4, the milling of the cavity 420 allows the decoupling capacitor 415 to be coupled to the BGA 405 via the two shortest vias 435f and 435g, which as described above, have been configured as connections to the power plane 440a. The resulting configuration results in the shortest possible loop between the power plane 440a and the decoupling capacitor 415, thus minimizing the loop inductance created by this pathway used to provide power to BGA 405. This allows PCB 400 to support faster processors and quicker response times while also reducing the impact of the loop inductance created by the decoupling capacitor 415 on power integrity. Reducing the loop inductance in the power plane also allows fewer decoupling capacitors to be used. As illustrated in FIG. 5, each row in the array of connection pads may include a separate decoupling capacitor 510. Due to the reduced loop inductance in the power plane, certain embodiments may support fewer decoupling capacitors such that a separate capacitor is not required for every row in the array.

FIG. 5 is a diagram of a three-dimensional cross-section view of a PCB 500 modified according to certain embodiments to include a variable-depth cavity on the bottom surface of the PCB 500. In the embodiment illustrated in FIG. 4, a two-dimension cross-section is depicted of one row of vias 435a-l of a PCB 400, with the cross-section bisecting the center of the BGA from edge to edge. In FIG. 5, a three-dimensional cross-section view depicts four such rows 535a-d of vias a PCB 500 configured similarly to the PCB 400 of FIG. 4. The PCB 500 illustrates a portion of an embodiment depicting four rows of vias 535a-d, each row extending from the edge of the PCB 500 at column 520a to the center area of the BGA 505. Also as with the embodiment of FIG. 4, BGA 500 is coupled to an array of connection pads provided on the surface of each of the vias in each of the rows of vias 535a-d.

In each of the rows of vias 535a-d, the shortest vias of columns 520f-g are connected to the power plane that provides power to BGA 505, thus providing power to BGA 505. As illustrated, such a configuration allows the decoupling capacitors 510 in each of the rows 535a-d to be located in the deepest portion of the cavity formed by the variable-depth milling described regard to FIG. 4. Also as described with regard to FIG. 4, PCB 500 is also designed such that along a single row of vias, each via that is progressively further from the center of the BGA 505 provides a connection to a trace layer that is progressively lower in the stack of trace layers 525. The illustrated staircase pattern 530 in the bottom cavity results from the milling of all via stubs in each of the rows 535a-d and other unnecessary dielectric material between each of the stubs.

As described, locating the decoupling capacitors 510 at the deepest point of the resulting cavity creates the shortest possible inductance loop between the power planes located at the top of the trace layers 525 of the PCB 500 and the power plane vias 520f-g, thus improving the ability of the decoupling capacitors 510 to support faster speeds and improved response times for processors powered by the power planes. In addition, removal of excess dielectric material between the stubs serves to minimize crosstalk within the PCB 500, thus further improving signal integrity.

In FIG. 5, the milling of the via stubs for each of the vias 520 f-g supporting the power plane results in a channel 515 that forms the deepest surface of the cavity resulting from the milling. In certain embodiments, the fabrication of the trace layers 525 of PCB 500 may include constructing the connection pads for use by the decoupling capacitors 510. In particular, when depositing the topmost of the trace layers 525 that will be used as a power plane, the connection pads to be used by decoupling capacitors 510 may also be deposited along with the power plane trace layer. When depositing these capacitor connection pads, certain embodiments may leave a thin void beneath each of the deposited connection pads. When milling the deepest portion of the cavity to create channel 515 for the decoupling capacitors 510, the milling depth in creating channel 515 may reach this void left beneath each of the connection pads, without contacting the connection pads themselves. By setting the milling depth within channel 515 in this manner, the bottom surface of the connection pad is exposed during milling without the milling bit scoring the connection pad. The bottom surface of the exposed connection pad is thus spared from damage during milling, thus providing a pristine, solderable surface to which the decoupling capacitors 510 may be attached, while also supporting a milling depth tolerance in the formation of channel 515 in which the decoupling capacitors will be located.

In another embodiments, PCB 500 of FIG. 5 may be fabricated by milling channel 515 prior to the drilling of the vias. Once the vias are drilled, conductive pads may be deposited within the milled channel 515, establishing a connection with the via and providing connection pads to which the decoupling capacitors 510 may be soldered. Milling channel 515 prior to drilling power plane vias thus allows for tolerance in the depth of the milling, while also providing a solderable connection pad for the decoupling capacitors 510.

It should be understood that various operations described herein may be implemented in software executed by processing circuitry, hardware, or a combination thereof. The order in which each operation of a given method is performed may be changed, and various operations may be added, reordered, combined, omitted, modified, etc. It is intended that the invention(s) described herein embrace all such modifications and changes and, accordingly, the above description should be regarded in an illustrative rather than a restrictive sense.

The terms "tangible" and "non-transitory," as used herein, are intended to describe a computer-readable storage medium (or "memory") excluding propagating electromagnetic signals; but are not intended to otherwise limit the type of physical computer-readable storage device that is encompassed by the phrase computer-readable medium or memory. For instance, the terms "non-transitory computer readable medium" or "tangible memory" are intended to encompass types of storage devices that do not necessarily store information permanently, including, for example, RAM. Program instructions and data stored on a tangible computer-accessible storage medium in non-transitory form may afterwards be transmitted by transmission media or signals such as electrical, electromagnetic, or digital signals, which may be conveyed via a communication medium such as a network and/or a wireless link.

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. A printed circuit board (PCB) comprising a plurality of layers and a plurality of electronic components connected to a top surface of the PCB, the PCB further comprising:
    a plurality of trace layers, wherein each trace layer is located at a respective depth within the PCB;
    a plurality of vias, wherein each via provides a signal pathway for one or more of the trace layers, and wherein each via, upon manufacture, comprises a stub portion not necessary for the signal pathway; and
    wherein a bottom surface of the PCB is milled to form a cavity in the bottom of the PCB, and wherein the milling removes the stub portions of at least a portion of the plurality of vias and also removes PCB material between the milled stub portions, and wherein a first electrical component is connected to a top surface of the cavity, wherein each of the via signal pathways connects a trace layer to a respective connector on the top surface of the PCB and wherein the respective connectors form an array of connectors on the top surface of the PCB, and wherein the cavity is a variable-depth cavity and wherein the depth of the variable-depth cavity is greatest at the center of the array of top surface connectors.

2. The PCB of claim 1, wherein the depth of the variable-depth cavity is least at the edges of the array of top surface connectors.

3. The PCB of claim 1, wherein the first electrical component is coupled to one or more of the plurality of electrical components on top of the PCB through a portion of a via remaining after milling, where the portion of the via extends from the top surface of the cavity to the top surface of the PCB.

4. The PCB of claim 1, wherein a trace layer designated as a power plane is the closest of the plurality of trace layers to the top surface of the PCB, and wherein the power plane provides power to a processor connected to the top surface of the PCB.

5. The PCB of claim 4,
    wherein the first electrical component comprises a capacitor connected to the power plane and further connected to the processor by a plurality of via portions remaining after milling.

6. The PCB of claim 5, wherein the capacitor is coupled to the top surface of the variable-depth cavity at its greatest depth.

7. An IHS (Information Handling System) comprising a printed circuit board (PCB) comprising a plurality of layers and a plurality of electronic components connected to a top surface of the PCB, the PCB further comprising:
    a plurality of trace layers, wherein each trace layer is located at a respective depth within the PCB;
    a plurality of vias, wherein each via provides a signal pathway for one or more of the trace layers, and wherein each via, upon manufacture, comprised a stub portion not necessary for the signal pathway; and
    wherein a bottom surface of the PCB is milled, wherein the milling forms a cavity in the bottom surface of the PCB, and wherein the milling removes the stub portions of at least a portion of the plurality of vias and also removes PCB material between the milted stub portions, and wherein a first electrical component is connected to a top surface of the cavity, wherein each of the via signal pathways connects a trace layer to a respective connector on the top surface of the PCB and wherein the respective connectors form an array of connectors on the top surface of the PCB, and wherein the cavity is a variable-depth cavity and wherein the depth of the variable-depth cavity is greatest at the center of the array of top surface connectors.

8. The IHS of claim 7, wherein the first electrical component is coupled to one or more of the plurality of electrical components on top of the PCB through a portion of a via remaining after milling, where the portion of the via extends from the top surface of the cavity to the top surface of the PCB.

9. The IHS of claim 7,
wherein a trace layer designated as a power plane is the closest of the plurality of trace layers to the top surface of the PCB.

10. The IHS of claim 9,
wherein the first electrical component comprises a capacitor connected to the power plane and also connected to a processor connected to the top surface of the PCB by a via portion located at the greatest depth of the variable-depth cavity.

11. A controller of an IHS (Information Handling System), the controller comprising:
a printed circuit board (PCB) comprising a plurality of layers and a plurality of electronic components connected to a top surface of the PCB, the PCB further comprising:
a plurality of trace layers, wherein each trace layer is located at a respective depth within the PCB;
a plurality of vias, wherein each via provides a signal pathway for one or more of the trace layers, and wherein each via, upon manufacture, comprises a stub portion not necessary for the signal pathway; and
wherein a bottom surface of the PCB is milled to form a cavity in the bottom of the PCB, and wherein the milling removes the stub portions of at least a portion of the plurality of vias and also removes the PCB material between the milled stub portions, and wherein a first electrical component is connected to a top surface of the cavity, wherein each of the via signal pathways connects a trace layer to a respective connector on the top surface of the PCB and wherein the respective connectors form an array of connectors on the top surface of the PCB, and wherein the cavity is a variable-depth cavity and wherein the depth of the variable-depth cavity is greatest at the center of the array of top surface connectors.

12. The controller of claim 1, wherein the depth of the variable-depth cavity is least at the edges of the array of top surface connectors.

13. The controller of claim 11, wherein the first electrical component is coupled to one or more of the plurality of electrical components on top of the PCB through a portion of a via remaining after milling, where the portion of the via extends from the top surface of the cavity to the top surface of the PCB.

14. The controller of claim 11, wherein a trace layer designated as a power plane is the closest of the plurality of trace layers to the top surface of the PCB, and wherein the power plane provides power to a processor connected to the top surface of the PCB.

15. The controller of claim 14,
wherein the first electrical component comprises a capacitor connected to the power plane and further connected to the processor by a plurality of via portions remaining after milling.

16. The controller of claim 15, wherein the capacitor is coupled to the top surface of the variable-depth cavity.

* * * * *